(12) United States Patent
B et al.

(10) Patent No.: US 11,867,583 B2
(45) Date of Patent: *Jan. 9, 2024

(54) LEADLESS PRESSURE SENSORS

(71) Applicant: Honeywell International Inc., Morris Plains, NJ (US)

(72) Inventors: Manjesh Kumar B, Karnataka (IN); Alistair David Bradley, Hilliard, OH (US); Josh M. Fribley, Columbus, OH (US); Sudheer Beligere Sreeramu, Karnataka (IN); Sathish Vadlamudi, Karnataka (IN)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,506

(22) Filed: Nov. 3, 2022

(65) Prior Publication Data
US 2023/0086677 A1 Mar. 23, 2023

Related U.S. Application Data

(63) Continuation of application No. 16/728,490, filed on Dec. 27, 2019, now Pat. No. 11,519,800.

(51) Int. Cl.
*G01L 9/00* (2006.01)
*B81B 7/00* (2006.01)
(Continued)

(52) U.S. Cl.
CPC .......... *G01L 9/0055* (2013.01); *B81B 7/0032* (2013.01); *H05K 1/141* (2013.01); *H10N 30/302* (2023.02); *B81B 2201/0264* (2013.01)

(58) Field of Classification Search
CPC ............... G01L 9/0055; G01L 19/0069; G01L 19/0076; G01L 9/0042; G01L 7/102;
(Continued)

(56) References Cited

U.S. PATENT DOCUMENTS 5,414,223 A 5/1995 Suski et al.
6,595,066 B1 7/2003 Kurtz et al.
(Continued)

FOREIGN PATENT DOCUMENTS

CN 201478293 U 5/2010
CN 101900625 A 12/2010
(Continued)

OTHER PUBLICATIONS

U.S. Appl. No. 16/728,490, filed Dec. 27, 2019, U.S. Pat. No. 11,519,800, Issued.
(Continued)

*Primary Examiner* — Nathaniel T Woodward
(74) *Attorney, Agent, or Firm* — Alston & Bird LLP

(57) ABSTRACT

Disclosed are pressure sensors including a die and an application-specific integrated circuit (ASIC) mounted on a top surface of a substrate. The pressure sensor can define an inner volume and a bottom opening configured to abut the substrate. The die and ASIC are mounted on the top surface of the substrate within the inner volume. The substrate defines a first aperture therethrough and the die defines a second aperture therethrough in a direction along an axis perpendicular to the substrate, the first aperture and the second aperture being aligned. Metallic barrier(s) disposed on a bottom surface of the substrate, circumferentially about the first aperture, can be at least partially coated with solder mask to reduce or prevent flow of unwanted materials past the metallic barriers and through the first aperture. The substrate can include electrical connection pads on the bottom surface configured to be in communication with a daughter board.

20 Claims, 7 Drawing Sheets

(51) Int. Cl.
*H05K 1/14* (2006.01)
*H10N 30/30* (2023.01)

(58) Field of Classification Search
CPC ......... G01L 9/06; G01L 9/065; G01L 13/028; G01L 19/04; B81B 7/0032; B81B 2201/0264; H01L 41/1132; H05K 1/141
See application file for complete search history.

(56) References Cited

U.S. PATENT DOCUMENTS

| | | | |
|---|---|---|---|
| 6,927,347 | B2 | 8/2005 | Yamaguchi et al. |
| 8,171,800 | B1 * | 5/2012 | Chiou ................... G01L 13/026 73/727 |
| 8,707,794 | B2 | 4/2014 | Usui |
| 2006/0033210 | A1 | 2/2006 | Chauhan et al. |
| 2011/0036174 | A1 * | 2/2011 | Hooper ............... G01L 19/0084 438/51 |
| 2011/0156237 | A1 | 6/2011 | Gulpen et al. |
| 2015/0247776 | A1 | 9/2015 | Wagner et al. |
| 2016/0169758 | A1 * | 6/2016 | Hooper ................. G01L 9/0073 73/717 |
| 2018/0313709 | A1 | 11/2018 | Chiou |

FOREIGN PATENT DOCUMENTS

| | | | |
|---|---|---|---|
| CN | 106461480 A | | 2/2017 |
| CN | 106461482 A | | 2/2017 |
| CN | 108141679 A | | 6/2018 |
| WO | 2017/027242 A1 | | 2/2017 |
| WO | WO-2017027242 A1 | * | 2/2017 ............. H04R 1/023 |

OTHER PUBLICATIONS

2nd Office Action for CN Application No. 202011325132.3 dated Dec. 16, 2022 w/English translation (20 pages).
CN Office Action dated Jun. 8, 2022 for CN Application No. 202011325132.
English translation of CN Office Action dated Jun. 8, 2022 for CN Application No. 202011325132.
European Search Report dated May 25, 2021 for EP Application No. 20212585.2, 8 page(s).
Non-Final Office Action dated Feb. 9, 2022 for U.S. Appl. No. 16/728,490.
Notice of Allowance and Fees Due (PTOL-85) dated Aug. 4, 2022 for U.S. Appl. No. 16/728,490.
CN Notice of Allowance dated Apr. 26, 2023 for CN Application No. 202011325132, 2 page(s).
English translation of CN Notice of Allowance dated Apr. 26, 2023 for CN Application No. 202011325132, 2 page(s).
Intention to grant dated Sep. 5, 2023 for EP Application No. 20212585, 9 page(s).

* cited by examiner

LEADLESS PRESSURE SENSORS

BACKGROUND

In the field of circuit boards, pressure sensors are often mounted on circuit boards to provide for pressure sensing in applications including, but not limited to, dialysis equipment, blood analysis, centrifugation, oxygen and nitrogen gas distribution, HVAC devices, data storage, process controls, industrial machinery, pumps, and robotics. Such pressure sensors are typically configured to include resistors, such as piezoresistors, disposed on a chemically etched silicon diaphragm, the pressure sensors configured such that a pressure change causes a strain in the diaphragm and the resistors. The resistor values change in proportion to the stress applied, which produces an electrical output. Through applied effort, ingenuity, and innovation, many identified problems have been solved by developing solutions that are included in embodiments of the present disclosure, many examples of which are described in detail herein.

SUMMARY

Apparatus, systems, and methods described herein relate to pressure sensors. In some embodiments, the pressure sensor can comprise a pressure sense die and an application-specific integrated circuit (ASIC) mounted on a substrate. In some embodiments, the pressure sensor can further comprise a pressure sensor assembly comprising an outer housing structure at least partially defining an inner volume, a bottom opening configured to abut or be supported on the substrate, and a top opening configured to allow communication of material, energy, force, or the like therethrough from an ambient atmosphere surrounding an outside of the pressure sensor assembly. In some embodiments, the inner volume can be at least partially defined by the portion of the substrate upon which the pressure sensor assembly is disposed. In some embodiments, the pressure sensor assembly can be mounted onto the substrate such that the pressure sense die and ASIC are within the inner volume. In some embodiments, the substrate can define a first aperture, such as a pressure gauge hole, therethrough. In some embodiments, the pressure sense die can define a second aperture therethrough in a direction along an axis perpendicular to the surface of the substrate. In some embodiments, the pressure sense die can be fixedly disposed on a surface of the substrate such that the first aperture and the second aperture are at least partially or fully aligned. In some embodiments, the inner volume can be configured to receive and retain a pressure transferring media, such as a viscous gel or non-compressible media.

In some embodiments, a pressure sensor can be configured to be operably coupled to, supported on, mounted to, electrically coupled to, physically coupled to, or otherwise disposed on a circuit board, such as a printed circuit board or a daughter board.

According to an embodiment, an apparatus is provided for sensing pressure, the apparatus comprising: a sensor housing disposed on a substrate, an aperture being defined through the substrate; a pressure sensor supported on the top surface of the substrate within the sensor housing; and one or more metallic barriers disposed on a bottom surface of the substrate circumferentially about the first aperture, the one or more metallic barriers being at least partially coated with a solder mask, wherein the one or more metallic barriers are configured to solder the substrate of the pressure sensor to a receiving circuit board and wherein the solder mask prevents or reduces the flow of matter past the one or more metallic barriers during or after soldering the substrate of the pressure sensor to the receiving circuit board. In some embodiments, the pressure sensor comprises a microelectro-mechanical systems (MEMS). In some embodiments, the MEMS sensor comprising a deformable membrane and configured to measure a change in conductance related to deformation of the deformable membrane. In some embodiments, the apparatus can further comprise an application-specific integrated circuit (ASIC) operably coupled to the pressure sensor and configured to measure a pressure, a pressure change, or a differential pressure based upon at least the change in conductance. In some embodiments, the one or more metallic barriers can comprise concentric metallic barriers circumferentially disposed about the first aperture. In some embodiments, the concentric metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the apparatus can further comprise one or more conductive pads configured to be electrically coupled to the receiving circuit board. In some embodiments, the substrate is an FR4 substrate. In some embodiments, pressure sensor is configured to measure any gauge or differential pressure of greater than or equal to about 1 bar, about 2 bar, about 3 bar, about 4 bar, about 5 bar, about 6 bar, about 7 bar, about 8 bar, about 9 bar, about 10 bar, about 11 bar, about 12 bar, about 13 bar, about 14 bar, or about 15 bar, inclusive of all values and ranges therebetween. In some embodiments, the solder mask comprises one of an epoxy liquid that is silkscreened through a pattern onto the substrate, a liquid photoimageable solder mask (LPSM or LPI) ink, or a dry-film photoimageable solder mask (DFSM).

According to another embodiment, a method is provided for manufacturing a pressure sensor assembly, the method comprising: providing a sensor housing disposed on a substrate, an aperture being defined through the substrate; providing a pressure sensor supported on the top surface of the substrate within the sensor housing; disposing one or more metallic barriers onto a bottom surface of the substrate circumferentially about the first aperture, the one or more metallic barriers being at least partially coated with a solder mask; and soldering, using the one or more metallic barriers, the substrate of the pressure sensor to a receiving circuit board, wherein, once the substrate has been soldered to the receiving circuit board, the solder mask is configured to prevent or reduce the flow of matter past the one or more metallic barriers during or after soldering the substrate of the pressure sensor to the receiving circuit board. In some embodiments, the pressure sensor comprises a microelectro-mechanical systems (MEMS). In some embodiments, the MEMS sensor comprising a deformable membrane and configured to measure a change in conductance related to deformation of the deformable membrane. In some embodiments, the method can further comprise providing an application-specific integrated circuit (ASIC) operably coupled to the pressure sensor and configured to measure a pressure, a pressure change, or a differential pressure based upon at least the change in conductance. In some embodiments, the one or more metallic barriers comprise concentric metallic barriers circumferentially disposed about the first aperture. In some embodiments, the concentric metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the method can further comprise providing one or more conductive pads configured to be electrically coupled to the receiving circuit board. In some embodiments, the substrate can be an FR4 substrate. In some embodiments, the pressure sensor is configured to measure any absolute, gauge, or differential pressure, as described above. In some embodiments, the solder mask comprises one of an epoxy liquid that is silkscreened through a pattern onto the substrate, a liquid photoimageable solder mask (LPSM or LPI) ink, or a dry-film photoimageable solder mask (DFSM).

According to yet another embodiment, a pressure sensor is provided, the pressure sensor comprising: a substrate defining a first aperture therethrough; a sensor assembly supported on a top surface of the substrate and defining an inner volume; a pressure sense die defining a second aperture therethrough, the pressure sense die disposed on the top surface of the substrate such that the first and second apertures are at least partially aligned; a microelectromechanical systems (MEMS) sensor supported on the top surface of the substrate within the inner volume, the MEMS sensor comprising a deformable membrane and configured to measure a change in conductance related to deformation of the deformable membrane; an application-specific integrated circuit (ASIC) operably coupled to the MEMS sensor and configured to measure a pressure, a pressure change, or a differential pressure based upon at least the change in conductance; and one or more metallic barriers disposed on a bottom surface of the substrate circumferentially about the first aperture, the one or more metallic barriers being at least partially coated with a solder mask, wherein the one or more metallic barriers are configured to solder the substrate of the pressure sensor to a receiving circuit board and wherein the solder mask prevents or reduces the flow of matter past the one or more metallic barriers during or after soldering the substrate of the pressure sensor to the receiving circuit board.

BRIEF DESCRIPTION OF THE DRAWINGS

The accompanying drawings, which constitute a part of the description, illustrate embodiments of the present invention and, together with the description thereof, serve to explain the principles of the present invention.

DETAILED DESCRIPTION

Figure 1A:
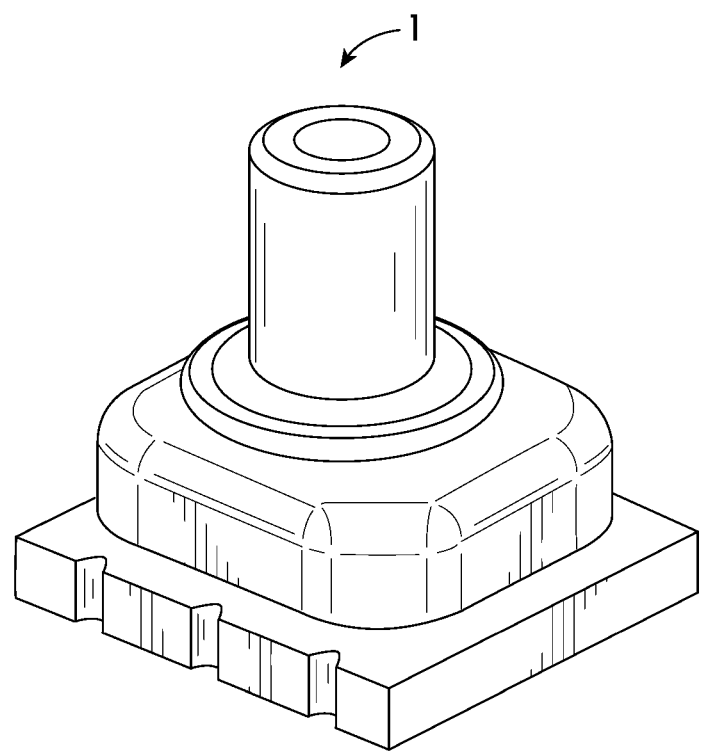
FIG. 1 illustrates various pressure sensors configured to be mounted on a circuit board, according to various embodiments of the present invention.
Figure 1B:
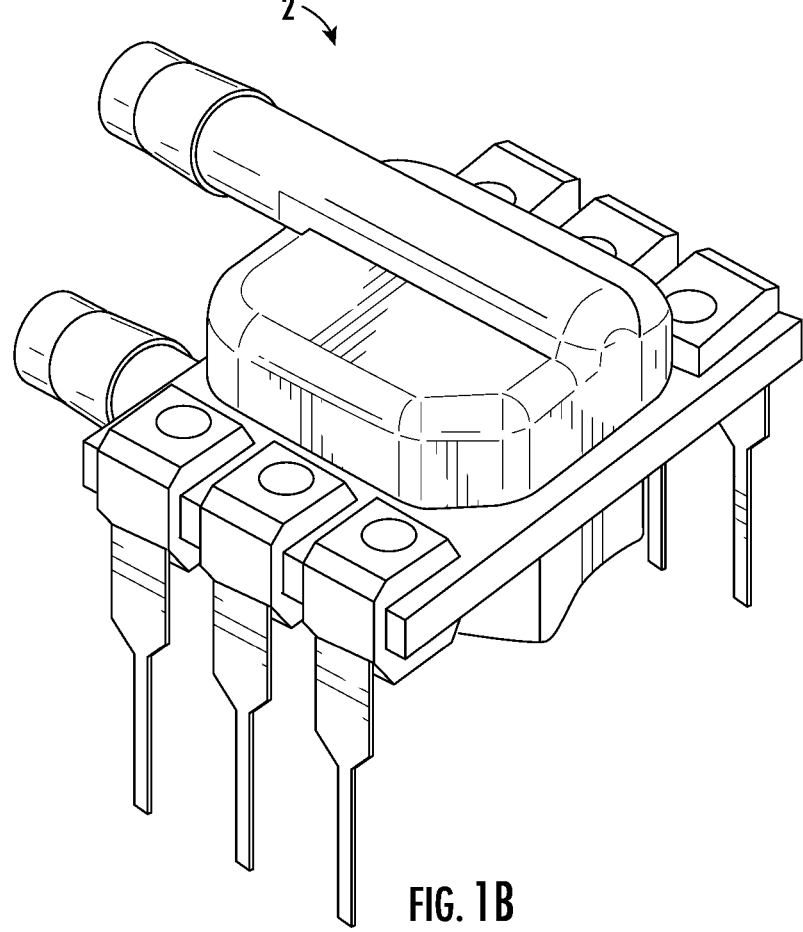
Figure 1C:
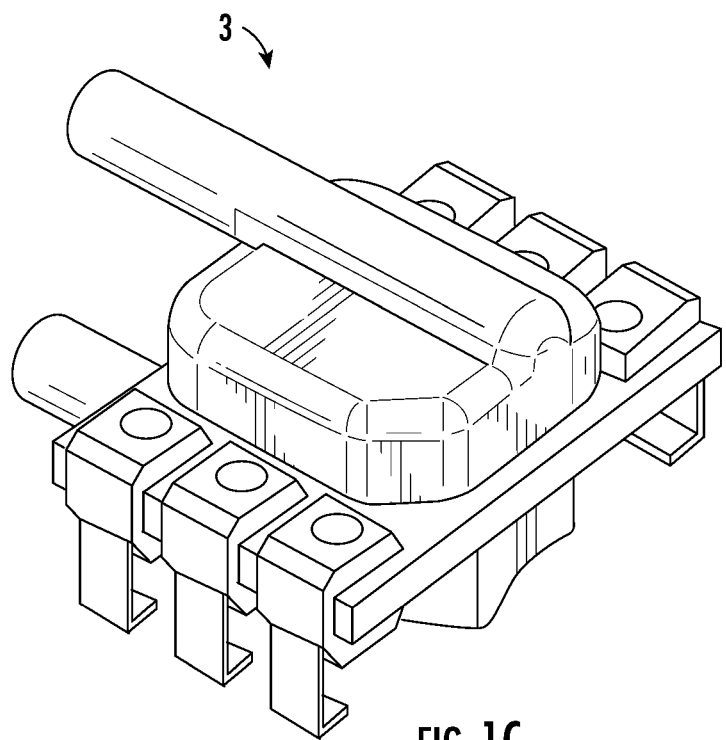
Figure 1D:
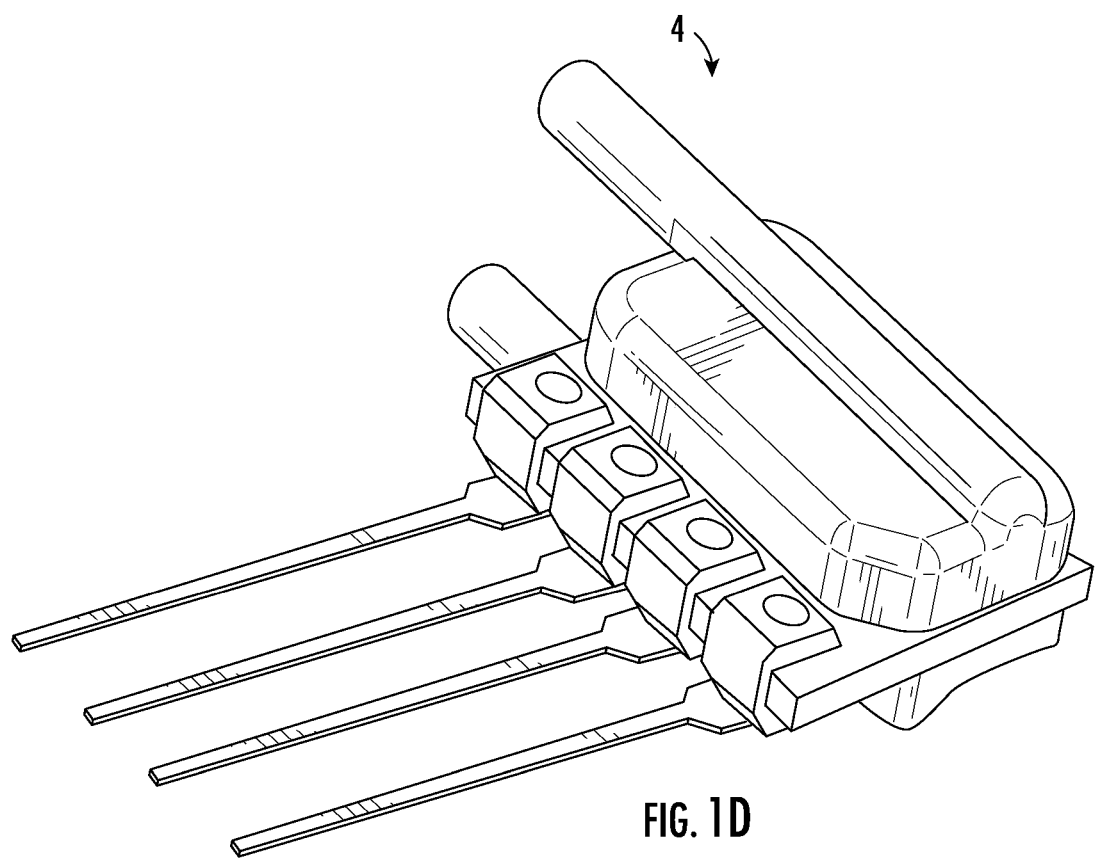

It should be understood that although illustrative implementations of one or more embodiments are disclosed and discussed below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. The following description of at least one exemplary embodiment is in fact merely illustrative and is in no way intended as a limitation to the present invention and its application or use.

Techniques and devices known to those of ordinary skill in the relevant art may not be discussed in detail but where appropriate, the techniques and devices should be considered as part of the description. Among all the examples shown and discussed herein, any specific value should be construed as merely illustrative and not as a limitation. Thus, other examples of exemplary embodiments may have different values. It should be noted that similar reference numerals and letters denote similar items in the accompanying drawings, and therefore, once an item is defined in a drawing, there is no need for further discussion in the accompanying drawings.

The following brief definition of terms shall apply throughout the application:

The term "comprising" means including but not limited to, and should be interpreted in the manner it is typically used in the patent context;

The phrases "in some embodiments," "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Pressure sensors are often mounted on circuit boards to provide for pressure sensing in applications including, but not limited to, dialysis equipment, blood analysis, centrifugation and oxygen and nitrogen gas distribution, HVAC devices, data storage, process controls, industrial machinery, pumps, and robotics. Such pressure sensors are typically configured to include resistors, such as piezoresistors, disposed on a chemically etched silicon diaphragm, the pressure sensors configured such that a pressure change causes a strain in the diaphragm and the resistors. The resistor values change in proportion to the stress applied, which produces an electrical output. However, such pressure sensors are often susceptible to damage from exposure to dust and other contaminants, high pressure conditions, and the like.

In some embodiments, pressure sensors can include board mounted pressure sensors, such as amplified board mounted pressure sensors and unamplified board mounted pressure sensors. Board mount pressure are available in market in various port configurations and electrical output style like Leadless, DIP, SMT and SIP packages. As illustrated in FIG. 1, pressure sensors can be mounted according to various mounting options, including but not limited to leadless 10, dual in-line package (DIP) 20, surface-mount technology (SMT) 30 and single in-line package (SIP) 40.

However, one possible drawback of leadless pressure sensors is that they typically may not be used for differential pressure measurement applications as leadless pressure sensors do not have dual port to measure multiple pressure points, and there is no ability to add additional ports on the other side as such additional ports would block the electrical coupling of the pressure sensor to a receiving circuit board.

As such, provided herein are an apparatus, system, and method for leadless pressure sensors having increased durability. In some embodiments, the pressure sensor can comprise a pressure sense die and an application-specific integrated circuit (ASIC) mounted on a substrate. In some embodiments, the pressure sensor can further comprise a pressure sensor assembly comprising an outer housing structure at least partially defining an inner volume, a bottom opening configured to abut or be supported on the substrate, and a top opening configured to allow communication of material, energy, force, or the like therethrough from an ambient atmosphere surrounding an outside of the pressure sensor assembly. In some embodiments, the inner volume can be at least partially defined by the portion of the substrate upon which the pressure sensor assembly is disposed. In some embodiments, the pressure sensor assembly can be mounted onto the substrate such that the pressure sense die and ASIC are within the inner volume. In some embodiments, the substrate can define a first aperture, such as a pressure gauge hole, therethrough. In some embodiments, the pressure sense die can define a second aperture therethrough in a direction along an axis perpendicular to the surface of the substrate. In some embodiments, the pressure sense die can be fixedly disposed on a surface of the substrate such that the first aperture and the second aperture are at least partially or fully aligned. In some embodiments, the inner volume can be configured to receive and retain a pressure transferring media, such as a viscous gel or non-compressible media.

In some embodiments, a pressure sensor can be soldered onto a circuit board, such as a daughter board. During the soldering process, for instance, the liquid solder paste, fumes from the soldering process, or other contaminants can flow into the pressure gauge hole at the bottom of the FR4 substrate due to various reasons and tend to alter the sensor performance which is not intended and may also stop the sensor from functioning. In some embodiments, the pressure sensor can comprise a pressure die and an ASIC mounted on a FR4 substrate with a pressure port to seal the media pressure. In some embodiments, the FR4 substrate can define a gauge hole therethrough to provide atmospheric and differential pressure inlet from back side of the pressure die. In some embodiments, the FR4 substrate is provided with copper pads at the bottom to establish the electrical connections with the pressure sensor. In some embodiments, a projected copper feature may be formed as part of FR4 design but without any contact with the electrical connection pads which are also made of same layer of copper foil and the project copper material is covered with a protective solder mask layer. In some embodiments, such a projected copper feature may form a barrier between the gage pressure hole and electrical connection pads. When soldering the pressure sensor device onto the circuit board, e.g., using a reflow process, there is an increased chance that excess solder, fumes from the soldering process, or other contaminants can flow through the gauge pressure hole. In some embodiments, the solder mask and copper barrier may reduce or stop the flow of any debris, contaminates and excess material from the reflow process past the solder point and prevent such contaminants and material from undesirably entering into the gage pressure hole.

In some embodiments, a leadless pressure sensor can include a substrate/printed circuit board (PCB) having a copper barrier covered with protective solder mask around a gage pressure hole on the bottom side. In some embodiments, the pressure sensor can include a second copper barrier without solder mask for creating a seal around gage pressure hole which allows for the addition of a second port/pressure source on the bottom side for differential pressure measurement.

In some embodiments, pressure sensors can include piezoresistive silicon pressure sensors offering a ratiometric analog or digital output for reading pressure over the specified full-scale pressure span and temperature range. In some embodiments, a pressure sensor can be calibrated and temperature compensated for sensor offset, sensitivity, temperature effects and accuracy errors (which include nonlinearity, repeatability and hysteresis) using an on-board Application Specific Integrated Circuit (ASIC). Calibrated output values for pressure are updated at approximately 1 kHz for analog and 2 kHz for digital.

Dry gases option: The input port is limited to non-corrosive, non-ionic media (e.g., dry air, gases) and should not be exposed to condensation. The gases are limited to media compatible with high temperature polyamide, silicone, alumina ceramic, silicon, gold, and glass.

Liquid media option: Includes an additional silicone-based gel coating to protect the electronics under port P1, which enables use with non-corrosive liquids (e.g. water and saline) and in applications where condensation can occur. Since port P2 is designed for use with non-corrosive liquids, this option is often suitable for wet-wet differential sensing.

In some embodiments, such pressure sensors can measure gage and/or differential pressures. In some embodiments, a pressure sensor can be configured to allow for wet/wet operation on dual ported devices. In some embodiments, such pressure sensors can be configured for a wide pressure range such as about 1 mbar to about 10 bar (about 6 kPa to 1 MPa or about 1 psi to about 150 psi) or greater. In some embodiments, the pressure sensors can have general configurations ranging from about 1 mm×about 1 mm, about 2 mm×about 2 mm, about 3 mm×about 3 mm, about 4 mm×about 4 mm, about 5 mm×about 5 mm, about 6 mm×about 6 mm, about 7 mm×about 7 mm, about 8 mm×about 7 mm, about 8 mm×about 8 mm, about 9 mm×about 9 mm, about 10 mm×about 10 mm, or larger. In some embodiments, such pressure sensors can remain calibrated over a temperature range of about −20° C. to about 85° C. In some embodiments, pressure sensors can be powered and operate using a single power supply of, for instance, 3.3 Vdc, 5.0 Vdc, or the like. In some embodiments, the output from such pressure sensors can include a ratiometric analog, I2C-, SPI-compatible 16-bit digital, or the like. In some embodiments, such pressure sensor can meet various standards such as IPC/JEDEC J-STD-020D, can be REACH or RoHS compliant, or the like. In some embodiments, the pressure sensor can comprise a silicon die having a movable membrane over a cavity in the base silicon.

In some embodiments, the solder material can comprise a lead-free SnAgCu solder material having a melting temperature of about 217° C. to about 221° C. for solder reflow applications. For example, a SnAgCu lead-free solder material can include alloys comprising between about 95.5% to 96.5% Sn, about 3.0% to 4.0% Ag, and about 0.5% to 0.7% Cu. In some embodiments, any other suitable solder material can be used, such as silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, combinations thereof, or the like.

In some embodiments, the solder mask material can include any suitable coating configured to cover electrical trace, electrical connections, and glass-reinforced epoxy laminate (such as FR4) on circuit boards and the like. For instance, in some embodiments, the solder mask material can comprise an epoxy liquid that is silkscreened through the pattern onto the circuit board/PCB, liquid photoimageable solder mask (LPSM or LPI) inks, and dry-film photoimageable solder mask (DFSM). A solder mask can prevent corrosion or oxidation of a coated metallic component such as solder, a trace, a conductive pad, a connector, or the like. In some embodiments, during or following the formation of a metallic barrier, such as a copper barrier about the aperture (e.g., gauge pressure hole) through an FR4 substrate, can prevent oxidation and/or corrosion, can prevent the flow of contaminants such as solder materials, liquids, gases, fine particulates, and the like. Such contaminants, if they are allowed past the barriers and into the aperture, can lead to deterioration or inoperability of the pressure sensor, and can lead to a reduction in overall durability and stability of the pressure sensor.

Figure 2:
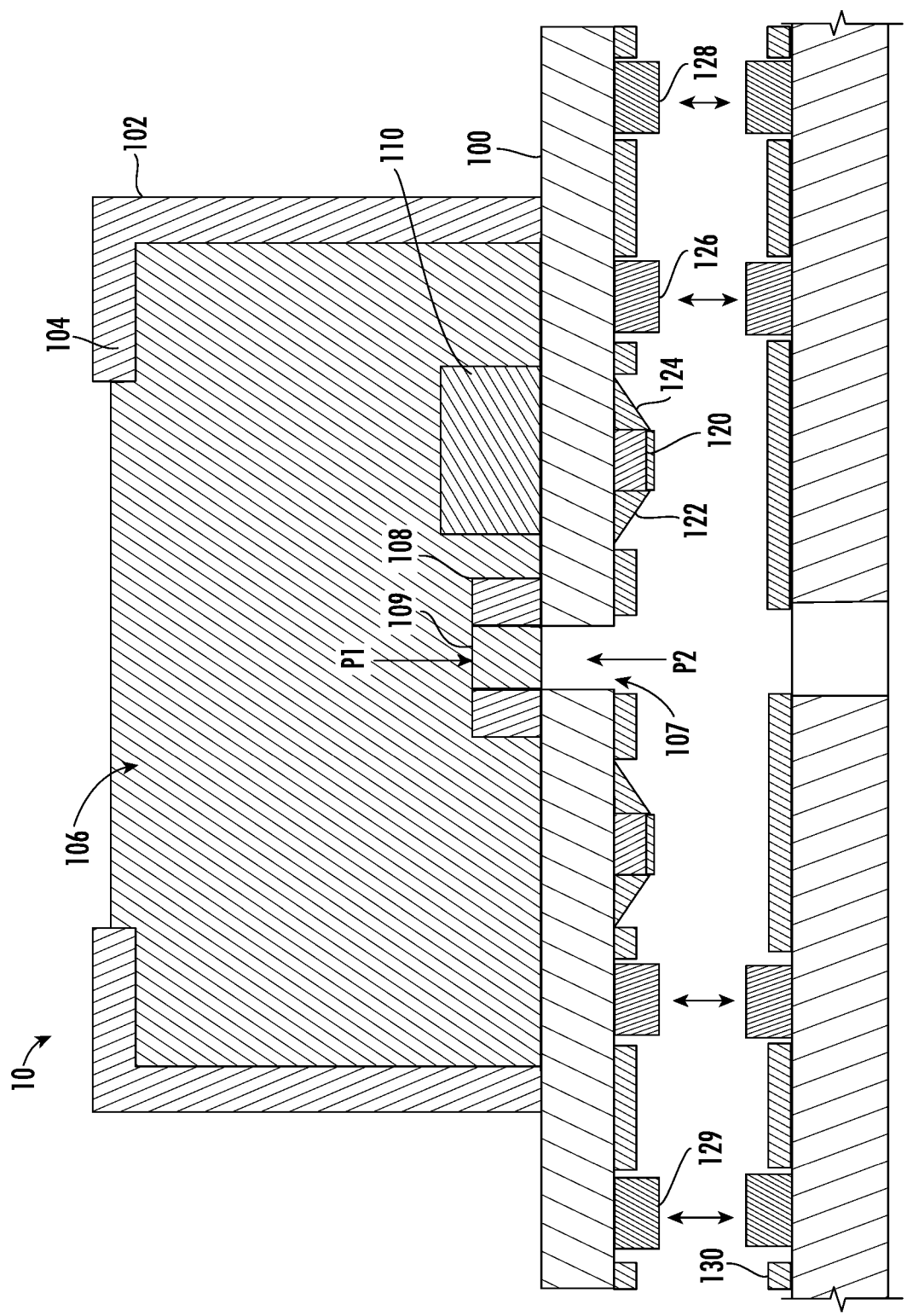
FIG. 2 shows a cross-sectional view of a leadless pressure sensor, according to an embodiment of the present invention.

Referring now to FIG. 2, an apparatus 10 can be provided for pressure sensing. The apparatus 10 includes a sensor housing 102 disposed on a substrate 100. In some embodiments, the apparatus 10 can further comprise a media retention collar 104 disposed about an opening at a top end of the sensor housing 102, the top end being opposite a bottom end of the sensor housing 102. The sensor housing 102 and/or at least a portion of the substrate 100 can define an inner volume 106 of the sensor housing 102. The inner volume 106 can be configured to retain a media, such as a viscous, gelatinous, solid-like, or otherwise non-compressible fluid. In some embodiments, a pressure sensor die 108 can be disposed on the substrate 100 in the inner volume 106. In some embodiments, an aperture 107 can be defined through the substrate 100. In some embodiments, the pressure sensor die 108 can be include a membrane 109, such as a microelectro-mechanical system (MEMS) membrane configured to correlate pressure-effected deformation of the membrane 109 with a change in electrical conductance. In some embodiments, the membrane 109 can be substantially aligned with the aperture 107 such that atmospheric pressure (P1, P2) on either side of the membrane 109 can cause deformation of the membrane 109. In some embodiments, the apparatus 10 can include one or more metallic barriers 120, 126 disposed on a bottom surface of the substrate circumferentially about the aperture 107. In some embodiments, the one or more metallic barriers 120, 126 can be at least partially coated with a solder mask 122, 124, wherein the one or more metallic barriers 120, 126 are configured to solder the substrate 100 of the apparatus 10 to a receiving circuit board 130. In some embodiments, the solder mask 122, 124 and metallic barriers 120, 126 may prevent or reduce flow of matter past the one or more metallic barriers 120, 126 during or after soldering the substrate 100 of the apparatus 10 to the receiving circuit board 130.

In some embodiments, the apparatus 10 can further comprise an application-specific integrated circuit 110 (ASIC 110) operably coupled (for example with wirebonds) to the pressure sensor die 108 and configured to measure a pressure, a pressure change, or a differential pressure based upon at least the change in conductance. In some embodiments, the one or more metallic barriers 120, 126 can comprise concentric metallic barriers circumferentially disposed about the first aperture 107. In some embodiments, the concentric metallic barriers can comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the apparatus 10 can further comprise one or more conductive pads 128, 129 configured to be electrically coupled to the receiving circuit board 130. In some embodiments, the substrate 100 is an FR4 substrate. In some embodiments, the pressure sensor die 108 can be configured to measure any gauge or differential pressure from below 1 mbar to above 15 bar, such as described hereinabove. In some embodiments, the solder mask 122, 124 can comprise one of an epoxy liquid that is silkscreened through a pattern onto the substrate, a liquid photoimageable solder mask (LPSM or LPI) ink, or a dry-film photoimageable solder mask (DFSM).

Figure 3A:
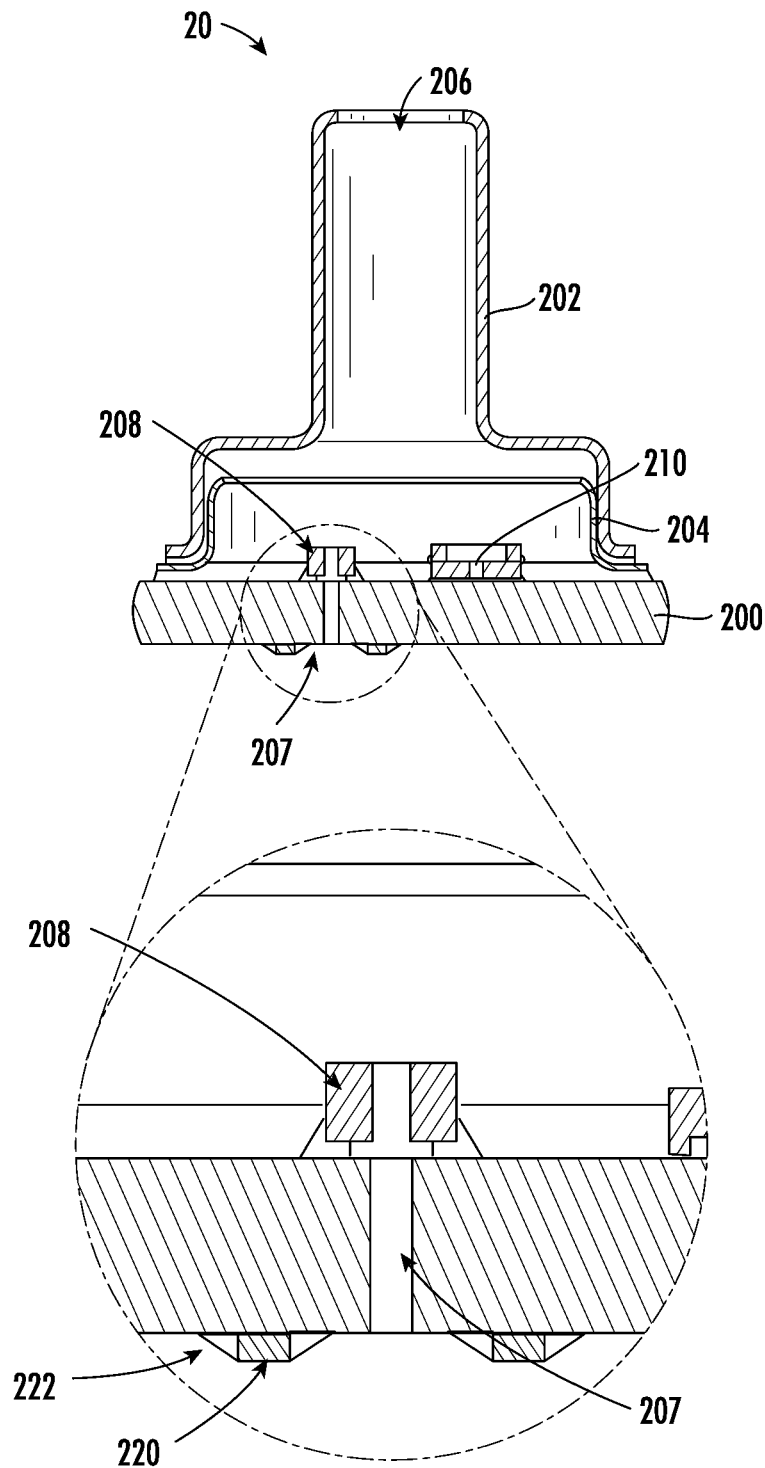
FIG. 3A shows a cross-section view of a leadless pressure sensor, according to an embodiment of the present invention.

Referring now to FIG. 3A, an apparatus 20 can be provided for pressure sensing. The apparatus 20 includes a sensor housing 202 disposed on a substrate 200. In some embodiments, the apparatus 20 can further comprise a media retention collar 204 disposed inside the sensor housing 202. In some embodiments, the sensor housing 202 and/or at least a portion of the substrate 200 can define an inner volume 206 of the sensor housing 202. The inner volume of 204 can be configured to retain a media, such as a viscous, gelatinous, solid-like, or otherwise non-compressible fluid. In some embodiments, a pressure sensor die 208 can be disposed on the substrate 200 in the inner volume of 204. In some embodiments, an aperture 207 can be defined through the substrate 200. In some embodiments, the pressure sensor die 208 can be include a membrane 209, such as a microelectro-mechanical system (MEMS) membrane configured to correlate pressure-effected deformation of the membrane 209 with a change in electrical conductance. In some embodiments, the membrane 209 can be substantially aligned with the aperture 207 such that pressure on either side of the membrane 209 can cause deformation of the membrane 209. In some embodiments, the apparatus 20 can include a metallic barrier 220 disposed on a bottom surface of the substrate 200 circumferentially about the aperture 207. In some embodiments, the metallic barrier 220 can be at least partially coated with a solder mask 222, and electrical connection pads 228a-f configured to solder the substrate 200 of the apparatus 20 to a receiving circuit board (not shown). In some embodiments, the solder mask 222 and metallic barrier 220 may prevent or reduce flow of matter into the aperture 207 during and after soldering the substrate 200 of the apparatus 20 to the receiving circuit board.

In some embodiments, the apparatus 20 can further comprise an application-specific integrated circuit 210 (ASIC 210) operably coupled (e.g., with wirebonds) to the pressure sensor die 208 and configured to measure a pressure, a pressure change, or a differential pressure based upon at least the change in conductance. In some embodiments, the metallic barrier 220 can comprise a concentric metallic barrier circumferentially disposed about the aperture 207. In some embodiments, the concentric metallic barrier can comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the pressure sensor die 208 can be configured to measure any gauge or differential pressure from below 1 mbar to above 15 bar, inclusive of all values and ranges therebetween, such as described hereinabove. In some embodiments, the solder mask 222 can comprise one of an epoxy liquid that is silkscreened through a pattern onto the substrate, a liquid photoimageable solder mask (LPSM or LPI) ink, or a dry-film photoimageable solder mask (DFSM).

As can be seen from Detail A, the pressure sensor die 208 can be mounted on the substrate 200 so that the aperture through the pressure sensor die 208 aligns at least substantially with the aperture 207 through the substrate 200. In some embodiments, a metal barrier 220 of copper can be disposed partially or completely about the aperture 207 through the substrate 200 on the bottom side of the substrate 200. The metal barrier 220 can be coated on a side, both sides, or both sides and the contacting surface of the metal barrier 220 with a solder mask material.

Figure 3B:
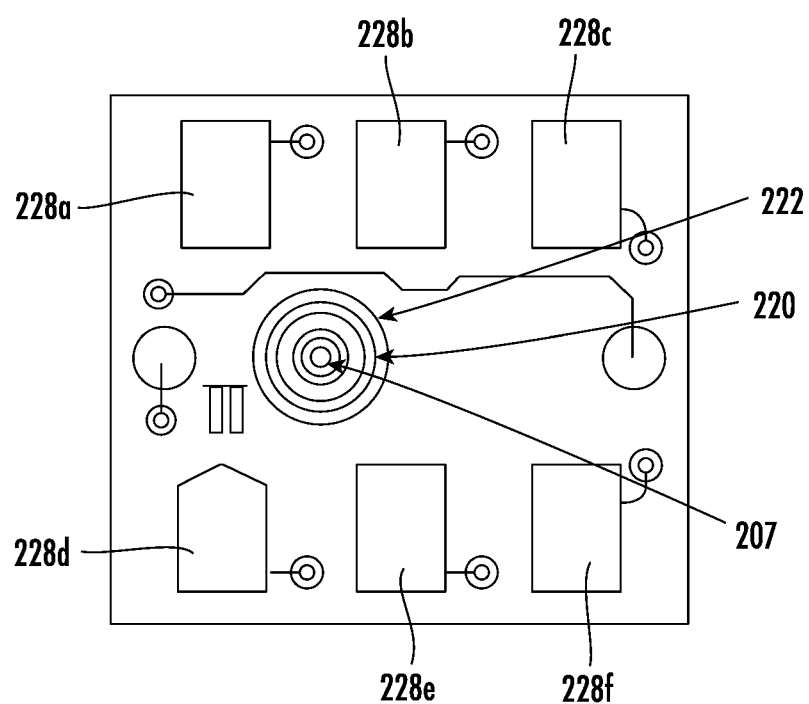
FIG. 3B shows a bottom view of a substrate configured to support a leadless pressure sensor, according to an embodiment of the present invention.

FIG. 3B illustrates the bottom surface of the substrate 200. In some embodiments, the apparatus 20 can further comprise one or more conductive pads 228a-f configured to be electrically coupled to the receiving circuit board. In some embodiments, the substrate 200 is an FR4 substrate. In some embodiments, the solder mask can coat some or all of the substrate 200 and/or the receiving circuit. As can be seen from FIG. 3B, the metallic barrier 220 can be disposed on a bottom surface of the substrate 200 and oriented circumferentially about the aperture 207.

Figure 4A:
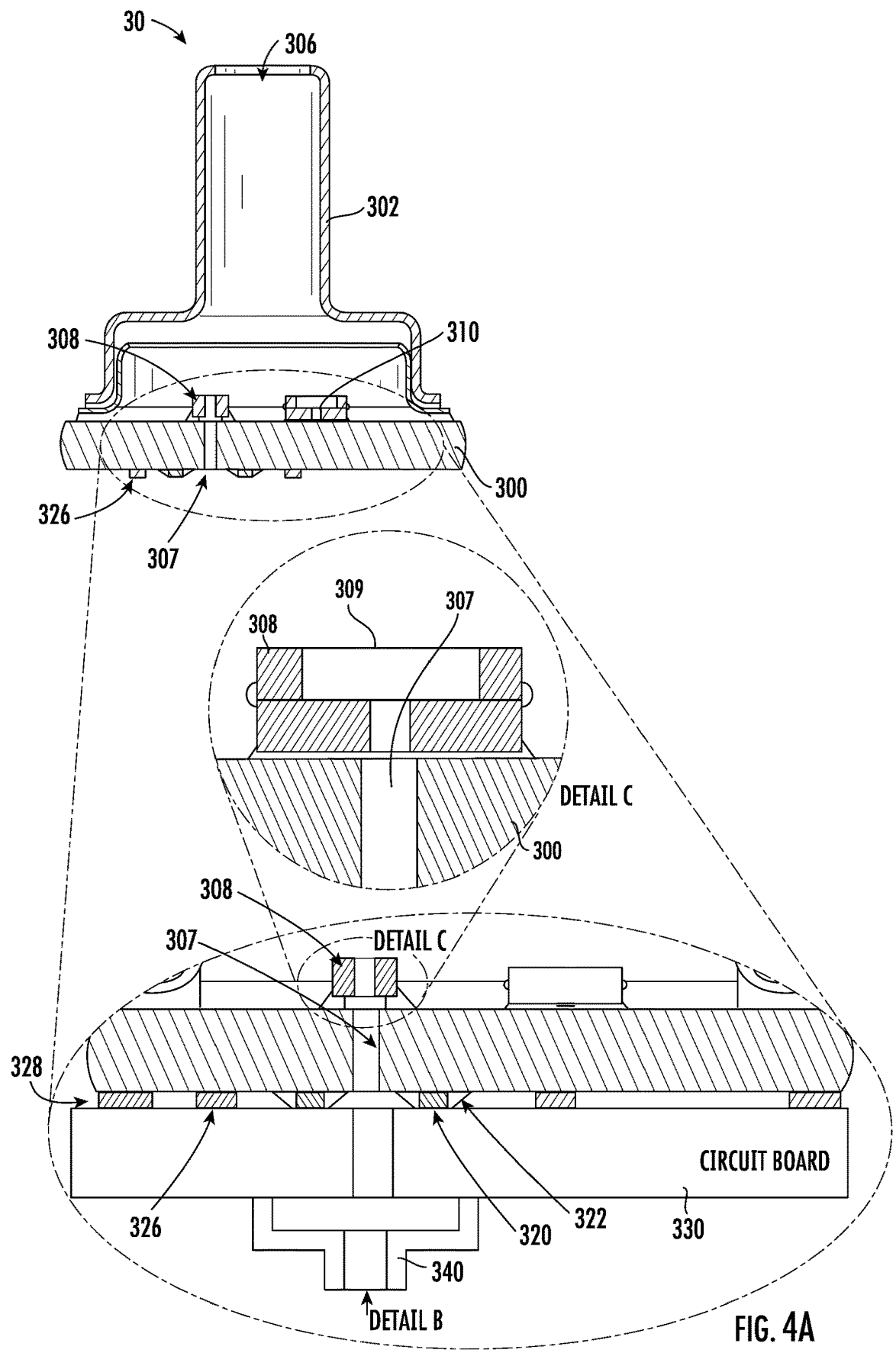
FIG. 4A shows a cross-section view of a leadless pressure sensor, according to an embodiment of the present invention.

Referring now to FIG. 4A, an apparatus 30 can be provided for pressure sensing. The apparatus 30 includes a sensor housing 302 defining an inner volume 306 configured to retain a media, such as a viscous, gelatinous, solid-like, or otherwise non-compressible fluid. In some embodiments, a pressure sensor die 308 can be disposed on the substrate 300 in the inner volume 306. In some embodiments, an aperture 307 can be defined through the substrate 300. In some embodiments, the pressure sensor die 308 can be include a membrane 309, such as a microelectro-mechanical system (MEMS) membrane configured to correlate pressure-effected deformation of the membrane with a change in electrical conductance. In some embodiments, the pressure sensor die 308 can be substantially aligned with the aperture 307 such that pressure on either side of the pressure sensor die 308 can cause deformation of the membrane. In some embodiments, the apparatus 30 can include a first metallic barrier 320 disposed on a bottom surface of the substrate 300 circumferentially about the aperture 307. In some embodiments, the apparatus 30 can further comprise a second metallic barrier 326 disposed about the aperture 307 and having a diameter that is larger than the diameter of the first metallic barrier 320. In some embodiments, the metallic barriers 320, 326 can be at least partially coated with a solder mask 322 wherein the metallic barriers 320, 326 can be configured to solder the substrate 300 of the apparatus 30 to a receiving circuit board 330. In some embodiments, the solder mask 322 and metallic barriers may prevent or reduce the flow of matter past the metallic barriers 320, 326 during or after soldering the substrate 300 of the apparatus 30 to the receiving circuit board 330.

In some embodiments, the apparatus 30 can further comprise an application-specific integrated circuit 310 (ASIC 310) operably coupled to the pressure sensor die 308 and configured to measure a pressure, a pressure change, or a differential pressure based upon at least the change in conductance. In some embodiments, the metallic barrier 320 can comprise a concentric metallic barrier circumferentially disposed about the aperture 307. In some embodiments, the concentric metallic barrier can comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the pressure sensor die 308 can be configured to measure any gauge or differential pressure from below 1 mbar to above 15 bar, inclusive of all values and ranges therebetween, as described hereinabove. In some embodiments, the solder mask 322 can comprise one of an epoxy liquid that is silkscreened through a pattern onto the substrate, a liquid photoimageable solder mask (LPSM or LPI) ink, or a dry-film photoimageable solder mask (DFSM).

As can be seen from Detail B, the pressure sensor die 308 can be mounted on the substrate 300 so that the aperture through the pressure sensor die 308 aligns at least substantially with the aperture 307 through the substrate 300. In some embodiments, a metal barrier 320 of copper can be disposed partially or completely about the aperture 307 through the substrate 300. The metal barrier 320 can be coated on a side, both sides, or both sides and the contacting surface of the metal barrier 320 with a solder mask material. As can be seen from Detail C, the pressure sensor die 308 is illustrated including a spacer, which can comprise a constraint or stress isolation layer composed of glass, silicon, ceramic, or the like. In some embodiments, the pressure sensor die 308 can be mounted on a substrate 300 that does not have or define an aperture, such as the aperture 307.

Figure 4B:
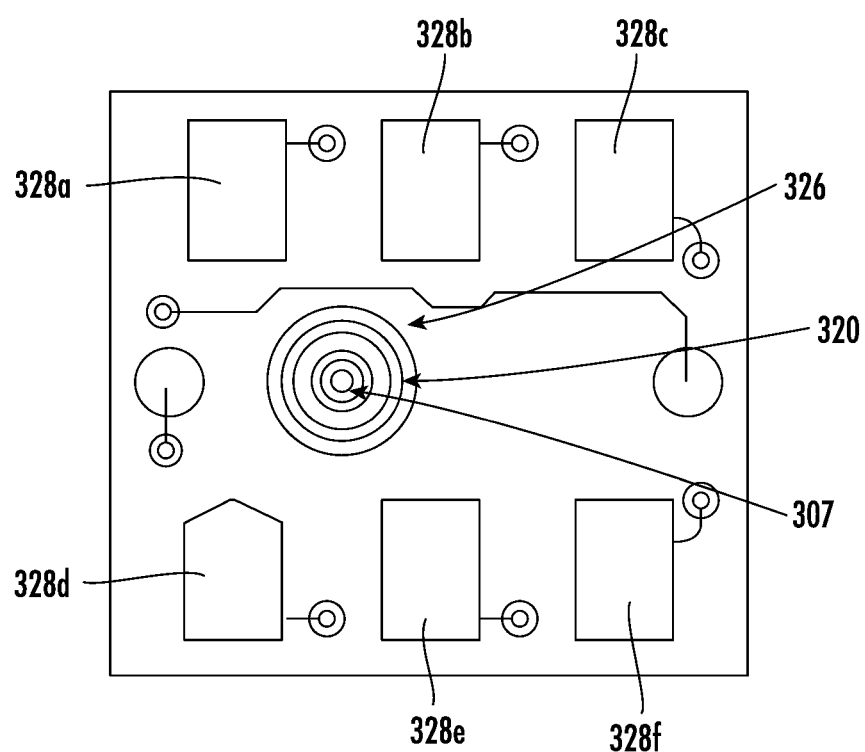
FIG. 4B shows a bottom view of a substrate configured to support a leadless pressure sensor, according to an embodiment of the present invention.

FIG. 4B illustrates the bottom surface of the substrate 300. In some embodiments, the apparatus 30 can further comprise one or more conductive pads 328a-f configured to be electrically coupled to the receiving circuit board 330. In some embodiments, the substrate 300 is an FR4 substrate. In some embodiments, the solder mask can coat some or all of the substrate 300 and/or the receiving circuit board 330. As can be seen from FIG. 4B, the metallic barriers 320, 326 can be disposed on a bottom surface of the substrate 300 and oriented circumferentially about the aperture 307. In some embodiments, the metallic barrier 320 can be at least partially coated with a solder mask 322 wherein the metallic barrier 326 can then be configured to solder and pressure seal the substrate 300 of the apparatus 30 to the receiving circuit board 330.

In some embodiments, a leadless pressure sensor can include a substrate/printed circuit board (PCB) having a copper barrier covered with protective solder mask around a gage pressure hole on the bottom side. In some embodiments, the pressure sensor can include a second copper barrier without solder mask for creating a seal around gage pressure hole which allows for the addition of a second port/pressure source on the bottom side for differential pressure measurement. For example, a second pressure port 340 can be mounted on the substrate to allow for the measurement of differential pressure, e.g., P1 vs. P2. In some embodiments, the concentric rings solder the pressure sensor to the substrate or the substrate to the receiving circuit board. In some embodiments, the concentric rings also form a seal so that pressure coming through the second pressure port 340 may be effectively communicated through to the pressure die 308 without any leak path. In some embodiments, the second pressure port 340 can be coupled to the receiving circuit board according to any suitable bonding method, such as by standard bonding, using an adhesive or adhesives, soldering, thermally fusing, melt bonding, combinations thereof, or the like.

According to other embodiments, a method of manufacturing an apparatus, such as the apparatus 10, the apparatus 20, or the apparatus 30, for pressure sensing may be provided. In some embodiments, the method may comprise providing a sensor housing 102, 202, 302 disposed on a substrate 100, 200, 300, an aperture 107, 207, 307 being, optionally, defined through the substrate. In some embodiments, the method can further comprise providing a pressure sensor die 108, 208, 308 supported on the top surface of the substrate 100, 200, 300 within the sensor housing 102, 202, 302. In some embodiments, the method can further comprise disposing one or more metallic barriers 120, 126, 220, 320, 326 onto a bottom surface of the substrate 100, 200, 300, e.g., disposed circumferentially about the first aperture 107, 207, 307. In some embodiments, the one or more metallic barriers 120, 126, 220, 320, 326 can be at least partially coated with a solder mask 122, 124, 222, 322. In some embodiments, the method can further comprise soldering, using the one or more metallic barriers 120, 126, 220, 320, 326, the substrate 100, 200, 300 of the pressure sensor apparatus 10, 20, 30 to a receiving circuit board 130, 330. In some embodiments, once the substrate 100, 200, 300 has been soldered to the receiving circuit board 130, 330, the solder mask 122, 124, 222, 322 is configured to prevent or reduce the flow of matter past the one or more metallic barriers 120, 126, 220, 320, 326 during or after soldering the substrate 100, 200, 300 of the pressure sensor apparatus 10, 20, 30 to the receiving circuit board 130, 330. In some embodiments, the pressure sensor apparatus 10, 20, 30 may comprise micro electromechanical systems (MEMS). In some embodiments, the MEMS sensor may comprise a deformable membrane and be configured to measure a change in conductance related to deformation of the deformable membrane. In some embodiments, the method can further comprise providing an application-specific integrated circuit 110, 210, 310 (ASIC 110, 210, 310) operably coupled to the pressure sensor die 108, 208, 308 and configured to measure a pressure, a pressure change, or a differential pressure based upon at least the change in conductance. In some embodiments, the one or more metallic barriers 120, 126, 220, 320, 326 comprises concentric metallic barriers circumferentially disposed about the first aperture 107, 207, 307. In some embodiments, the concentric metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the method can further comprise providing one or more conductive pads 128, 129, 228a-228f, 328a-328f configured to be electrically coupled to the receiving circuit board 130, 330. In some embodiments, the substrate 100, 200, 300 can be an FR4 substrate.

In some embodiments, the pressure sensor assembly 10, 20, 30 is configured to measure any gauge or differential pressure from below 1 mbar to above 15 bar, inclusive of all values and ranges therebetween, such as described hereinabove. In some embodiments, the solder mask 122, 124, 222, 322 comprises one of an epoxy liquid that is silkscreened through a pattern onto the substrate, a liquid photoimageable solder mask (LPSM or LPI) ink, or a dry-film photoimageable solder mask (DFSM).

Apparatus, systems, and methods described herein relate to pressure sensors. In some embodiments, the pressure sensor can comprise a pressure sense die and an application-specific integrated circuit (ASIC) mounted on a substrate. In some embodiments, the pressure sensor can further comprise a pressure sensor assembly comprising an outer housing structure at least partially defining an inner volume, a bottom opening configured to abut or be supported on the substrate, and a top opening configured to allow communication of material, energy, force, or the like therethrough from an ambient atmosphere surrounding an outside of the pressure sensor assembly. In some embodiments, the inner volume can be at least partially defined by the portion of the substrate upon which the pressure sensor assembly is disposed. In some embodiments, the pressure sensor assembly can be mounted onto the substrate such that the pressure sense die and ASIC are within the inner volume. In some embodiments, the substrate can define a first aperture, such as a pressure gauge hole, therethrough. In some embodiments, the pressure sense die can define a second aperture therethrough in a direction along an axis perpendicular to the surface of the substrate. In some embodiments, the pressure sense die can be fixedly disposed on a surface of the substrate such that the first aperture and the second aperture are at least partially or fully aligned. In some embodiments, the inner volume can be configured to receive and retain a pressure transferring media, such as a viscous gel or non-compressible media. In some embodiments, the non-compressible media can comprise a food-grade gel.

In some embodiments, a pressure sensor can be configured to be operably coupled to, supported on, mounted to, electrically coupled to, physically coupled to, or otherwise disposed on a circuit board, such as a printed circuit board or a daughter board.

According to an embodiment, an apparatus is provided for sensing pressure, the apparatus comprising: a sensor housing disposed on a substrate, an aperture being defined through the substrate; a pressure sensor supported on the top surface of the substrate within the sensor housing; and one or more metallic barriers disposed on a bottom surface of the substrate circumferentially about the first aperture, the one or more metallic barriers being at least partially coated with a solder mask, wherein the one or more metallic barriers are configured to solder the substrate of the pressure sensor to a receiving circuit board and wherein the solder mask prevents or reduces the flow of matter past the one or more metallic barriers during or after soldering the substrate of the pressure sensor to the receiving circuit board. In some embodiments, the pressure sensor comprises a microelectro-mechanical systems (MEMS). In some embodiments, the MEMS sensor comprising a deformable membrane and configured to measure a change in conductance related to deformation of the deformable membrane. In some embodiments, the apparatus can further comprise an application-specific integrated circuit (ASIC) operably coupled to the pressure sensor and configured to measure a pressure, a pressure change, or a differential pressure based upon at least the change in conductance. In some embodiments, the one or more metallic barriers can comprise concentric metallic barriers circumferentially disposed about the first aperture. In some embodiments, the concentric metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the apparatus can further comprise one or more conductive pads configured to be electrically coupled to the receiving circuit board. In some embodiments, the substrate is an FR4 substrate. In some embodiments, pressure sensor is configured to measure any gauge or differential pressure from below 1 mbar to above 15 bar, inclusive of all values and ranges therebetween, such as described hereinabove. In some embodiments, the solder mask comprises one of an epoxy liquid that is silkscreened through a pattern onto the substrate, a liquid photoimageable solder mask (LPSM or LPI) ink, or a dry-film photoimageable solder mask (DFSM).

According to another embodiment, a method is provided for manufacturing a pressure sensor assembly, the method comprising: providing a sensor housing disposed on a substrate, an aperture being defined through the substrate; providing a pressure sensor supported on the top surface of the substrate within the sensor housing; disposing one or more metallic barriers onto a bottom surface of the substrate circumferentially about the first aperture, the one or more metallic barriers being at least partially coated with a solder mask; and soldering, using the one or more metallic barriers, the substrate of the pressure sensor to a receiving circuit board, wherein, once the substrate has been soldered to the receiving circuit board, the solder mask is configured to prevent or reduce the flow of matter past the one or more metallic barriers during or after soldering the substrate of the pressure sensor to the receiving circuit board. In some embodiments, the pressure sensor comprises a microelectromechanical systems (MEMS). In some embodiments, the MEMS sensor comprising a deformable membrane and configured to measure a change in conductance related to deformation of the deformable membrane. In some embodiments, the method can further comprise providing an application-specific integrated circuit (ASIC) operably coupled to the pressure sensor and configured to measure a pressure, a pressure change, or a differential pressure based upon at least the change in conductance. In some embodiments, the one or more metallic barriers comprises concentric metallic barriers circumferentially disposed about the first aperture. In some embodiments, the concentric metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof. In some embodiments, the method can further comprise providing one or more conductive pads configured to be electrically coupled to the receiving circuit board. In some embodiments, the substrate can be an FR4 substrate. In some embodiments, the pressure sensor is configured to measure any gauge or differential pressure from below 1 mbar to above 15 bar, inclusive of all values and ranges therebetween, such as described hereinabove. In some embodiments, the solder mask comprises one of an epoxy liquid that is silkscreened through a pattern onto the substrate, a liquid photoimageable solder mask (LPSM or LPI) ink, or a dry-film photoimageable solder mask (DFSM).

According to yet another embodiment, a pressure sensor is provided, the pressure sensor comprising: a substrate defining a first aperture therethrough; a sensor assembly supported on a top surface of the substrate and defining an inner volume; a pressure sense die defining a second aperture therethrough, the pressure sense die disposed on the top surface of the substrate such that the first and second apertures are at least partially aligned; a microelectromechanical systems (MEMS) sensor supported on the top surface of the substrate within the inner volume, the MEMS sensor comprising a deformable membrane and configured to measure a change in conductance related to deformation of the deformable membrane; an application-specific integrated circuit (ASIC) operably coupled to the MEMS sensor and configured to measure a pressure, a pressure change, or a differential pressure based upon at least the change in conductance; and one or more metallic barriers disposed on a bottom surface of the substrate circumferentially about the first aperture, the one or more metallic barriers being at least partially coated with a solder mask, wherein the one or more metallic barriers are configured to solder the substrate of the pressure sensor to a receiving circuit board and wherein the solder mask prevents or reduces the flow of matter past the one or more metallic barriers during or after soldering the substrate of the pressure sensor to the receiving circuit board.

To provide an overall understanding, certain illustrative embodiments have been described; however, it will be understood by one of ordinary skill in the art that the systems, apparatuses, and methods described herein can be adapted and modified to provide systems, apparatuses, and methods for other suitable applications and that other additions and modifications can be made without departing from the scope of the systems, apparatuses, and methods described herein.

The embodiments described herein have been particularly shown and described, but it will be understood that various changes in form and details may be made. Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the scope of the disclosed and exemplary systems, apparatuses, or methods of the present disclosure.

Although specific embodiments have been illustrated and described herein, it will be appreciated by those of ordinary skill in the art that any arrangement that is adapted to achieve the same purpose may be substituted for the specific embodiments shown. Many adaptations will be apparent to those of ordinary skill in the art. Accordingly, this application is intended to cover any adaptations or variations.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In this Detailed Description, various features may have been grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the embodiments should be determined with reference to the appended claims, along with the full scope of equivalents to which such claims are entitled.

The invention claimed is:

1. An apparatus comprising:
a pressure sensor supported on the top surface of a substrate within a sensor housing, wherein the substrate defines an aperture;
a media retention collar disposed about an opening at a top end of the sensor housing; and
one or more metallic barriers disposed on a bottom surface of the substrate circumferentially about the first aperture, at least some of the one or more metallic barriers being at least partially coated with a solder mask,
wherein the one or more metallic barriers are configured to solder the substrate of the pressure sensor to a receiving circuit board.

2. The apparatus of claim 1, wherein the solder mask prevents or reduces flow of matter past the one or more metallic barriers during or after soldering the substrate of the pressure sensor to the receiving circuit board.

3. The pressure sensor of claim 1, wherein the pressure sensor comprises a microelectromechanical systems (MEMS), the MEMS sensor comprising a deformable membrane and configured to measure a change in conductance related to deformation of the deformable membrane.

4. The pressure sensor of claim 3, further comprising:
an application-specific integrated circuit (ASIC) operably coupled to the pressure sensor and configured to measure a pressure, a pressure change, or a differential pressure based upon at least the change in conductance.

5. The pressure sensor of claim 1, wherein the one or more metallic barriers comprises a first metallic barrier circumferentially disposed about the first aperture and a second metallic barrier circumferentially disposed about the first metallic barrier, the second metallic barrier being at least partially coated with the solder mask and forming an airtight seal between the pressure sensor and the top side of the substrate, the first metallic barrier being uncoated by any of the solder mask.

6. The pressure sensor of claim 5, wherein at least one of the first metallic barrier and the second metallic barrier comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof.

7. The pressure sensor of claim 5, wherein the pressure sensor is a first pressure sensor and wherein a second pressure sensor is disposed on the bottom side of the substrate such that a differential pressure can be measured as a comparison of pressure measured by the first pressure sensor to pressure measured by the second pressure sensor.

8. The pressure sensor of claim 1, further comprising:
one or more conductive pads configured to be electrically coupled to the receiving circuit board.

9. The pressure sensor of claim 1, wherein the substrate is an FR4 substrate.

10. The pressure sensor of claim 1, wherein the pressure sensor is configured to measure a gauge pressure or a differential pressure up to about 15 bar.

11. The pressure sensor of claim 1, wherein the solder mask comprises one of an epoxy liquid that is silkscreened through a pattern onto the substrate, a liquid photoimageable solder mask (LPSM or LPI) ink, or a dry-film photoimageable solder mask (DFSM).

12. A method of manufacturing a pressure sensor assembly, the method comprising:
providing a sensor housing disposed on a substrate, an aperture being defined through the substrate;
providing a pressure sensor supported on the top surface of the substrate within the sensor housing;
disposing a media retention collar about an opening at a top end of the sensor housing;
disposing one or more metallic barriers onto a bottom surface of the substrate circumferentially about the first aperture, the one or more metallic barriers being at least partially coated with a solder mask; and
soldering, using the one or more metallic barriers, the substrate of the pressure sensor to a receiving circuit board.

13. The method of claim 12, wherein, once the substrate has been soldered to the receiving circuit board, the solder mask is configured to prevent or reduce matter flowing past the one or more metallic barriers during or after soldering the substrate of the pressure sensor to the receiving circuit board.

14. The method of claim 12, wherein the pressure sensor comprises a microelectro-mechanical systems (MEMS), the MEMS comprising a deformable membrane and configured to measure a change in conductance related to deformation of the deformable membrane.

15. The method of claim 14, further comprising:
providing an application-specific integrated circuit (ASIC) operably coupled to the pressure sensor and configured to measure a pressure, a pressure change, or a differential pressure based upon at least the change in conductance.

16. The method of claim 12, wherein the substrate is an FR4 substrate, and wherein the one or more metallic barriers comprises a first metallic barrier circumferentially disposed about the first aperture and a second metallic barrier circumferentially disposed about the first metallic barrier, the second metallic barrier being at least partially coated with the solder mask and forming an airtight seal between the pressure sensor and the top side of the FR4 substrate, the first metallic barrier being uncoated by any of the solder mask.

17. The method of claim 12, wherein the one or more metallic barriers comprise a conductive metal or metal alloy comprising one or more of tin, silver, copper, gold, aluminum, calcium, beryllium, rhodium, magnesium, molybdenum, iridium, tungsten, zinc, cobalt, cadmium, nickel, ruthenium, lithium, iron, palladium, tin, selenium, tantalum, niobium, steel, chromium, lead, vanadium, antimony, zirconium, titanium, mercury, or combinations thereof.

18. The method of claim 12, wherein the pressure sensor is configured to measure a gauge pressure or a differential pressure up to about 15 bar.

19. The method of claim 12, wherein the solder mask comprises one of an epoxy liquid that is silkscreened through a pattern onto the substrate, a liquid photoimageable solder mask (LPSM or LPI) ink, or a dry-film photoimageable solder mask (DFSM).

20. A pressure sensor comprising:
a substrate defining a first aperture therethrough;
a sensor assembly supported on a top surface of the substrate and defining an inner volume;
a media retention collar disposed about an opening at a top end of the sensor assembly;
a pressure sense die defining a second aperture therethrough, the pressure sense die disposed on the top surface of the substrate such that the first and second apertures are at least partially aligned;
a microelectro-mechanical systems (MEMS) sensor supported on the top surface of the substrate within the inner volume, the MEMS sensor comprising a deformable membrane and configured to measure a change in conductance related to deformation of the deformable membrane;
an application-specific integrated circuit (ASIC) operably coupled to the MEMS sensor and configured to measure a pressure, a pressure change, or a differential pressure based upon at least the change in conductance; and
one or more metallic barriers disposed on a bottom surface of the substrate circumferentially about the first aperture, the one or more metallic barriers being at least partially coated with a solder mask,
wherein the one or more metallic barriers are configured to solder the substrate of the pressure sensor to a receiving circuit board and wherein the solder mask prevents or reduces matter flow past the one or more metallic barriers during or after soldering the substrate of the pressure sensor to the receiving circuit board.

* * * * *